United States Patent
Werle et al.

(10) Patent No.: US 8,952,704 B2
(45) Date of Patent: *Feb. 10, 2015

(54) TEST ARRANGEMENT FOR AC TESTING OF ELECTRICAL HIGH VOLTAGE COMPONENTS

(75) Inventors: Peter Werle, Walsrode (DE); Matthias Steiger, Schierau (DE); Juergen Wohlfarth, Halle (DE)

(73) Assignee: ABB Technology AG, Zürich (CH)

( * ) Notice: Subject to any disclaimer, the term of this patent is extended or adjusted under 35 U.S.C. 154(b) by 367 days.

This patent is subject to a terminal disclaimer.

(21) Appl. No.: 12/963,144

(22) Filed: Dec. 8, 2010

(65) Prior Publication Data

US 2011/0133749 A1 Jun. 9, 2011

Related U.S. Application Data

(63) Continuation of application No. PCT/EP2009/004001, filed on Jun. 4, 2009.

(30) Foreign Application Priority Data

Jun. 12, 2008 (EP) .................................. 08010691

(51) Int. Cl.
*G01R 31/02* (2006.01)
*G01R 31/12* (2006.01)
*H01F 27/40* (2006.01)

(52) U.S. Cl.
CPC .......... *G01R 31/021* (2013.01); *G01R 31/1227* (2013.01); *G01R 31/027* (2013.01); *H01F 27/402* (2013.01)
USPC .......................................... 324/543; 324/537

(58) Field of Classification Search
None
See application file for complete search history.

(56) References Cited

U.S. PATENT DOCUMENTS

| | | | |
|---|---|---|---|
| 2,032,904 A | | 3/1936 | Bellaschi |
| 2,237,812 A | * | 4/1941 | De Blieux ..................... 361/603 |
| 2,551,841 A | | 5/1951 | Kepple et al. |
| 4,367,512 A | * | 1/1983 | Fujita ............................ 361/625 |
| 4,427,898 A | * | 1/1984 | Miyake et al. ................ 307/9.1 |
| 4,535,253 A | * | 8/1985 | Ootsuka et al. ............... 307/9.1 |
| 5,845,854 A | | 12/1998 | Adam et al. |

(Continued)

FOREIGN PATENT DOCUMENTS

| | | |
|---|---|---|
| AT | 330 887 B | 7/1976 |
| DE | 521 475 C | 3/1931 |

(Continued)

OTHER PUBLICATIONS

"Mobile on-site test system for off-line tests and diagnostics at power transformers" by Winter et al. 2006.*

(Continued)

*Primary Examiner* — Paresh Patel
(74) *Attorney, Agent, or Firm* — Buchanan Ingersoll & Rooney PC

(57) ABSTRACT

A test arrangement is provided for AC testing of electrical high voltage components including at least one inverter, at least one test transformer and at least one high-voltage inductor arranged as test components in a common cuboid container. The at least one high-voltage inductor is at least partly removable from the container through at least one opening on a boundary surface of the container by means of a movement apparatus.

20 Claims, 1 Drawing Sheet

(56) References Cited

U.S. PATENT DOCUMENTS

| | | |
|---|---|---|
| 6,211,683 B1 | 4/2001 | Wolf |
| 6,586,697 B1 | 7/2003 | Enns |
| 7,394,171 B2 | 7/2008 | Loppacher |

FOREIGN PATENT DOCUMENTS

| | | |
|---|---|---|
| DE | 1 563 442 | 4/1970 |
| DE | 23 28 375 A1 | 1/1975 |
| DE | 196 39 023 A1 | 3/1998 |
| DE | 20 2009 001 837 U1 | 5/2009 |
| EP | 2 133 704 A1 | 12/2009 |
| JP | 61102176 A | 5/1986 |
| SU | 1179234 | 9/1985 |
| WO | WO 2009/149866 A1 | 12/2009 |

OTHER PUBLICATIONS

"Mobile on-site test system for off-line tests and diagnostics at power transformers" by winter et al. Sep. 2006 pp. 275-279 (See exhibit A under affidavit filed on Nov. 12, 2013).*
Winter A. et al., "A mobile transformer test system based on a stativ frequency converter", Sep. 4, 2007, pp. 1-6.
Schufft E. et al., "Frequency-tuned resonant test systems for on-site testing and diagnostics of extruded cables", High Voltage Engineering, vol. 5, Aug. 23, 1999, pp. 335-339.
Schierig S. et al., "HV AC generation based on resonant circuits with variable frequency for testing of electrical power equipment on site" Apr. 21, 2008, pp. 684-691.
Lopez-Roldan et al., "Mobile Substations: Application, Engineering and Structural Dynamics", Jan. 1, 2006, pp. 951-956.
International Search Report (PCT/ISA/210) dated Oct. 23, 2009.
Alexander Winter et al., "A new Generation of On-Site Test Systems for Power Transformers", Jun. 10, 2008, pp. 478-485.
T. Grun et al., "Equipment for On-site Testing of HV Insulation", vol. 5, Aug. 23, 1999, pp. 240-243.
Jose Lopez-Roldan et al., "How to Achieve a Rapid Deployment of Mobile Substations and to Guarantee Its Integrity During Transport", vol. 23, No. 1, Jan. 2008, pp. 196-202.
High Volt: "Tuneable Modular Reactors of High Power, Types DERI . . . M, G", Data Sheet No. 1.22/4, Apr. 1, 2007, pp. 1-3.
Haefely High Voltage Test, "Impulse Voltage Test System SGSA", 2001, pp. 1-18, XP-0091090930.
Klaus Schwenk et al., "Load Range Extension Methods for Lightning Impulse Testing With High Voltage Impulse Generators", 6 pages.
M. Loppacker, "On-Site Impulse Tests and Corresponding State of The Art Measurement and Analysis Techniques for Power Transformers", Haefely High Voltage Test, 1999, 5 pages.
European Search Report issued on Nov. 26, 2008, EP 2 133 704 A1.
International Search Report (PCT/ISA/210) issued on Nov. 3, 2009, by European Patent Office as the International Searching Authority for International Application No. PCT/EP2009/003977.
International Search Report (PCT/ISA/210) issued on Nov. 4, 2009, by European Patent Office as the International Searching Authority for International Application No. PCT/EP2009/003976.
International Search Report (PCT/ISA/210) issued on Nov. 9, 2009, by European Patent Office as the International Searching Authority for International Application No. PCT/EP2009/004048.
International Search Report (PCT/ISA/210) issued on Nov. 3, 2009, by European Patent Office as the International Searching Authority for International Application No. PCT/EP2009/003756.
Notice of Opposition filed in corresponding European Patent Application No. 2286254 on May 23, 2012.
Notice of Opposition filed in corresponding European Patent Application No. 213388 filed May 9, 2012.
Eklund et al., "Transformation vor Ort", ABB Technik Apr. 2007, pp. 45-48.
Eklund et al., "Increase transformer reliability and availability: From condition assessment to On-Site Repair", Power-Gen Middle East, Bahrain, 2007, pp. 1-17.
Presentation for "Mobile on-site test system for off-line tests and diagnostics at power transformers", ABB, 2006, pp. 1-17.
Dissertation of Dipl-Ing. Florian Martin, "Hochspannungsprüfsystem auf Basis leistungselektronischer Frequenzkonverter", May 20, 2008, pp. 1-188.
Data Sheet No. 1.22/2, "Tunable Modular, Reactors of High Power, Types DERI . . . M, G", High Volt, XP007910187.
Küchler, Prof. Dr.-Ing. Andreas, "Hochspannungstechnik", Springer, Verlag Bern Heidelberg 2005, p. 444.
Office Action dated Jun. 20, 2013 issued by the U.S. Patent and Trademark Office in corresponding U.S. Appl. No. 12/963,941.

\* cited by examiner

TEST ARRANGEMENT FOR AC TESTING OF ELECTRICAL HIGH VOLTAGE COMPONENTS

RELATED APPLICATION

This application claims priority as a continuation application under 35 U.S.C. §120 to PCT/EP2009/004001, which was filed as an International Application on Jun. 4, 2009 designating the U.S., and which claims priority to European Application 08010691.7 filed in Europe on Jun. 12, 2008. The entire contents of these applications are hereby incorporated by reference in their entireties.

FIELD

The present disclosure relates to a test arrangement for AC voltage testing of electrical high-voltage components, such as at least one inverter, at least one test transformer and at least one high-voltage inductor arranged as test components in a common cuboid container.

BACKGROUND INFORMATION

It is generally known that high-voltage components, such as power transformers, are subject to an ageing process which can affect electrical insulation, for example. Tests, on the power transformers, for example, are therefore worthwhile at specific time intervals to ensure correct operation of an electrical power distribution system with such high-voltage components. A test such as this is also required after the repair or servicing of a transformer. Tests such as these provide an indication of the state, for example, of the insulation and also allow the detection of other faults in the relevant high-voltage component.

High-voltage components such as power transformers are very heavy, and may even be more than 100 tonnes, depending on the electrical rating. Because of the high transport cost for the respective power transformer, it is unfeasible to transport a power transformer of this weight which has been installed within an electrical power distribution system, to a fixed-installed test panel in which it could be tested by means of an AC voltage test. Furthermore, there would need to be sufficient redundancy in a power distribution system to allow a power transformer to be removed without adversely affecting the system operation.

For this reason, such AC voltage tests of power transformers are generally carried out in situ. The test arrangement with the AC voltage generator and additional components which are required for the test, such as high-voltage inductors, voltage dividers, and measurement and evaluation apparatuses, are transported in a plurality of assemblies to the site where the power transformer to be tested is located, and is assembled there to form a test arrangement. The high-voltage inductor which is required to form a resonant circuit with the unit under test, for a resonant test, can represent a test component with a considerable size, because it has a height, for example, of 2.5 m and an internal diameter of, for example, 1 m. The voltage divider which is required to measure the high voltages of, for example, up to several 100 kV in the resonant circuit is also a component with a similar height.

When carrying out an AC voltage test, care must be taken to ensure that the components of the test arrangement are sufficiently far apart from one another, and are sufficiently far away from the adjacent ground potential, because of the high voltages which occur.

One disadvantage is that the assembly of the various assemblies on site involves a considerable amount of time. In particular, the positioning and assembly of a high-voltage inductor or of a voltage divider are highly time consuming.

Against this background, exemplary embodiments of the present disclosure provide a test arrangement which occupies less space and which can be transported in a reduced number of assemblies.

SUMMARY

An exemplary embodiment provides a test arrangement for AC voltage testing of electrical high-voltage components. The exemplary test arrangement includes test components, which can include at least one inverter, at least one test transformer, and at least one high-voltage inductor. The exemplary test arrangement also includes a cuboid container in which the test components are commonly arranged. The exemplary test arrangement also includes a first movement apparatus configured to move the at least one high-voltage inductor at least partially out of the container, through at least one first opening on a boundary surface of the container.

BRIEF DESCRIPTION OF THE DRAWINGS

Additional refinements, advantages and features of the present disclosure are described in more detail below with reference to exemplary embodiments illustrated in the drawings, in which.

Figure 1:
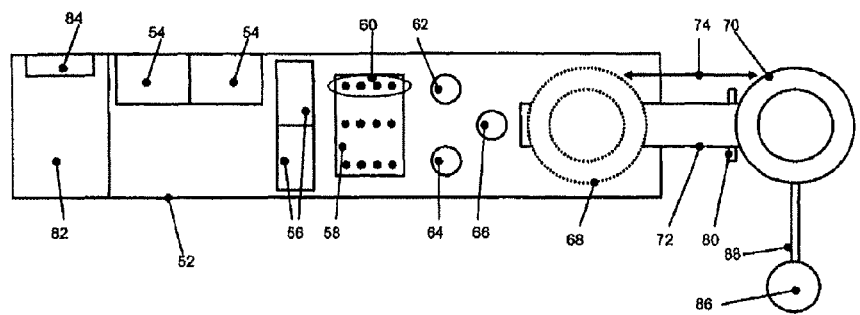
FIG. 1 shows a plan view of an exemplary test arrangement according to an embodiment of the present disclosure.

A summary of the reference symbols used in the drawings is provided in the list of reference symbols below.

DETAILED DESCRIPTION

Exemplary embodiments of the present disclosure provide a test arrangement for AC voltage testing of electrical high-voltage components arranged as test components in a common cuboid carrier. The test components can include, for example, at least one inverter, at least one test transformer and at least one high-voltage inductor. The at least one high-voltage inductor can be moved at least partially out of the container, through at least one opening on a boundary surface of the container, by means of a movement apparatus.

The isolation separations between the high-voltage inductor and additional adjacent component(s), and/or the adjacent ground potential, can thus be increased. According to an exemplary embodiment, the high-voltage inductor within the container therefore results in a particularly space-saving arrangement, which makes it easier to transport the test arrangement. In an arrangement in which the high-voltage inductor is outside the container, the isolation separations are increased, thus allowing the operation of the arrangement, or at least making it safer from the isolation point of view. The change between the arrangement variants is carried out by the movement apparatus, in a particularly simple form.

The compact arrangement of the inductor within the container advantageously makes it easier to transport the container and those components of the test arrangement which are arranged in it.

In accordance with an exemplary embodiment of the test arrangement, a voltage divider can be moved at least partially out of the container, through at least one further opening on a boundary surface of the container, by means of a further movement apparatus.

A voltage divider, which can be connected in a resonant circuit in the test arrangement, is a component with a similar height to a high-voltage inductor, and with similar isolation requirements. The space advantages which result for a high-voltage inductor which can be moved out of the container accordingly also apply to a voltage divider which can be moved out of the container.

In accordance with an exemplary embodiment of the test arrangement, the at least one opening and/or the at least one further opening can each be located on a vertical boundary surface of the container, and the movement apparatus and/or the further movement apparatus can act predominantly in the horizontal direction.

This therefore allows the high-voltage inductor and/or the voltage transformer to be moved horizontally out of the container on one side or on one end surface. One example of a suitable movement apparatus is a telescopic rail.

In accordance with an exemplary embodiment of the test arrangement according to the present disclosure, the horizontally acting movement apparatus and/or the further horizontally acting movement apparatus, with the high-voltage inductor which has been moved at least partially out of the container, and/or with the voltage divider, can each be supported at the bottom by means of a supporting apparatus. In a similar manner to that in which a mobile crane can be secured against tilting, a supporting apparatus such as this is, for example, a spindle which is arranged in a vertical threaded channel and which can be moved along the threaded channel by a rotary movement in such a way that it forms a support between the movement apparatus and the ground underneath. A multiplicity of further embodiments of a supporting apparatus are also possible.

The maximum torque load acting on the outer edge of the container from the respective movement apparatus is thus reduced, and its design is therefore simplified. This also improves the stability of the container.

In accordance with an exemplary embodiment of the test arrangement, the at least one opening and/or at least one further opening can be located on the upper boundary surface of the container, and the movement apparatus acts predominantly in the vertical direction. This allows the high-voltage inductor and/or the voltage divider to be moved out of the container vertically, through its roof. One example of a suitable movement apparatus in each case is a hydraulic lifting apparatus.

The at least one opening and/or at least one further opening in the container can advantageously be closed. When the container is being transported with closed openings, the components of the test arrangement located in it are therefore better protected.

In accordance with an exemplary embodiment of the test arrangement, the movement apparatus and/or the further movement apparatus can each be provided with a drive (e.g., a drive mechanism). This therefore simplifies the movement process.

In accordance with an exemplary embodiment of the test arrangement, the container is connected to a transport apparatus which has wheels which support it, for example, a goods vehicle with a trailer. This makes it easier to transport the test arrangement.

In this context, the container can be in the form of a freight container with predetermined dimensions (e.g., standard dimensions in a particular field), for example a freight container with a length of 40 feet. In accordance with an exemplary embodiment, the container can be constructed and/or licensed in accordance with the CSC (Container Safety Convention) and can therefore be placed in any desired position within a container stack on a container ship. This further improves the transportability of the test arrangement.

In accordance with an exemplary embodiment of the test arrangement, the container can have an internal area at its first end, in which area measurement apparatuses and/or evaluation apparatuses are arranged.

By way of example, a measurement apparatus is provided in order to measure and to record the voltage profile during an AC voltage test, with a voltage which is reduced to a low voltage level by means of the voltage divider being measured. An evaluation apparatus is provided in order to evaluate the measured and recorded voltage values and, for example, to provide a statement on the state of the insulation of the tested high-voltage component, for example a power transformer.

In accordance with an exemplary embodiment of the test arrangement, at least some of the test components are electrically connected to one another by means of an insulated high-voltage cable. The minimum separation required for isolation reasons between the test components can thus be reduced further.

In accordance with an exemplary embodiment of the test arrangement according to the present disclosure, the test arrangement can include an electrical resonant circuit having at least the high-voltage inductor and a high-voltage component to be tested, as well as the voltage divider connected thereto.

A resonant circuit is one possible way to produce high test voltages. Because the test voltages which are produced have a magnitude, for example, of 500 kV, the length of a corresponding voltage divider required for isolation purposes can be about 2.5 m, as is known by a person skilled in the art. According to an exemplary embodiment of the present disclosure, this length also corresponds approximately to the length of a high-voltage inductor according to the which, for example, has an unobstructed internal diameter of about 1 m.

According to an exemplary embodiment of the present disclosure, the resonant circuit can be excited by means of the inverter and the test transformer which is electrically connected to it. The electrical rating of an inverter such as this is, for example, several 100 kVA. The inverter produces a variable-frequency AC voltage which is regulated at the resonant frequency of the resonant circuit. This is initially dependent on the capacitance and inductance of the unit under test, but also on the inductance of the high-voltage inductor and the capacitance of the voltage divider. The test components are designed such that the resonant frequency for typical units under test does not exceed about 100 Hz.

In accordance with an exemplary embodiment of the test arrangement, the high-voltage inductor can have at least one electrical conductor which is arranged in a multiplicity of turns around a winding axis, with the turns radially surrounding an internal area along the winding axis, and with at least one capacitor being arranged in this internal area, by means of which, together with the at least one further capacitor which is electrically connected thereto, the functionality of the voltage divider is formed.

In an arrangement such as this, it is possible, for example, to comply with the isolation requirements between the turns of the high-voltage inductor and the internally arranged capacitor. Accordingly, it is expedient to provide a winding former, around which the turns of the high-voltage inductor are normally arranged, in an insulation material of sufficient thickness, for example of several centimeters, depending on the voltage load.

The arrangement of a capacitor in the interior of a high-voltage inductor, for example as a component of a voltage divider, makes advantageous use of the space available there.

In accordance with an exemplary embodiment of the test arrangement, at least one operation which is required during a test process, or the entire test process can be initiated by means of remote control. The use of remote control advantageously reduces the assembly effort required for the test arrangement and, furthermore, allows an AC voltage test to be carried out more easily.

FIG. 1 shows a plan view of an exemplary test arrangement 50 according to an embodiment of the present disclosure. A plurality of test components of a test system 50 according to an exemplary embodiment of the present disclosure are illustrated on the floor surface of a cuboid container 52. For clarity of illustration, the roof surface of the container 52 is not shown.

Two inverter arrangements 54 are arranged in the front area of the container 52, as shown on the left-hand side of FIG. 1, and are connected to a voltage supply, for example of 400 V, with three phases, at 50 Hz. The respective connecting lines between the individual components are not shown in this illustration.

In the case of a 3-phase AC voltage test, each of the three AC voltages which are produced is transformed via a test transformer 58 to a higher voltage level and is supplied to a unit under test, with the respective voltages being convertible, by voltage transformers 62, 64, 66 for measurement purposes, down to a lower, measurable voltage. By way of example, the voltage transformers 62, 64, 66 have a height of about 1 m and are arranged, for example, such that the isolation separations within the container 52 and from the walls of the container 52 allow a maximum voltage of 220 kV. This voltage is sufficient for 3-phase AC voltage tests such as these. Measurement and evaluation apparatuses 84 are provided in the measurement room 82 in the area illustrated on the left side of the container 52 in the example of FIG. 1, and are used to allow measurement signals that are supplied thereto to be recorded, stored and evaluated. A filter 56 is provided in order, if appropriate, to smooth the AC voltages produced by the first inverter 54. Furthermore, according to an exemplary embodiment, apparatuses for power factor correction can also be arranged in the container 52, in which case the power factor correction can also be carried out, if required, by the filter 56.

A high-voltage inductor 68, 70 is indicated in dashed-line form in a first position 68 in the right-hand inner area of the first container 52. In this first position, the isolation separations which are required for operation of the high-voltage inductor 68, 70, for example, from the side walls of the container 52, are not complied with. This first position within the container 52 is, however, suitable for transport purposes for the test arrangement.

In the case of a resonant test, the high-voltage inductor 68, 70 is connected in a resonant circuit with the unit under test. A resonant test is carried out on one phase, that is to say only a single AC voltage is produced by the first inverter 54, and only one high-voltage inductor 68, 70 is required. The voltages which occur during a resonant test are often higher than those in a normal AC voltage test, for example 500 kV, for which reason the voltage transformers 62, 64, 66 may not be suitable for direct use.

The high-voltage inductor can now be seen in the second position 70 to which it has been moved by means of the movement apparatus 72, for example, an extendable telescopic rail. The movement apparatus 72 is supported by means of a supporting apparatus 80 with respect to the surface on which the container 52 is standing. This therefore prevents an increased bending load on the movement apparatus 72. In addition to the extended, high-voltage inductor 70, a voltage divider 86 is illustrated, which is electrically connected via a connection 88 to the high-voltage inductor 70. In accordance with an exemplary embodiment of the present disclosure, the voltage divider 86 has not been moved by means of a movement apparatus, but has been moved out of the container 52, and connected, manually.

Figure 2:
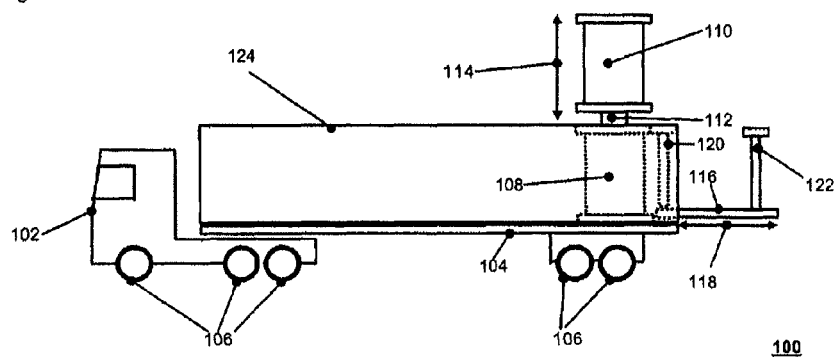
FIG. 2 shows a side view of an exemplary test arrangement according to an embodiment of the present disclosure.

FIG. 2 shows a side view of an exemplary test arrangement 100 according to an embodiment of the present disclosure. A high-voltage inductor is indicated in a first position 108 by means of a dashed line within a container 124. In the example of FIG. 2, the container 124 is illustrated in the form of a 40-foot freight container. The container 124 is illustrated on a first transport apparatus 102 and on a second transport apparatus 104, with associated wheels 106, e.g., a goods vehicle with a trailer. The position within the boundaries of the container 124 advantageously allows the high-voltage inductor 108 to be transported in a protected manner. In order to protect the test arrangement, the container 124 can be closed on all six side walls during transport. Before a process of moving the high-voltage inductor 108, 110, an opening must first of all be produced in a corresponding manner through the outer boundary of the container 124, through which the high-voltage inductor 108, 110 can be moved from the inside outwards. For this purpose, at least one segment of the relevant boundary wall can be removed or moved, for example, by a drive mechanism, or else manually.

Furthermore, the high-voltage inductor is illustrated in a second position 110 outside the container 124. This second position 110 of the high-voltage inductor can be reached from the first position by means of a movement apparatus 112, for example a lifting apparatus. In the illustrated example of FIG. 2, the movement direction runs vertically and is indicated by the arrow 114. However, it is also possible for the high-voltage inductor to be moved in the horizontal direction through a side surface or end surface of the container 124.

Analogously to the high-voltage inductor 108, 110, a voltage divider is also illustrated in an inner position 120 and in an outer position 122. In the illustrated example of FIG. 2, the movement direction runs horizontally and is indicated by the arrow 118. However, the voltage divider 120, 122 can also be moved in the vertical direction through the roof surface of the container 124.

Figure 3:
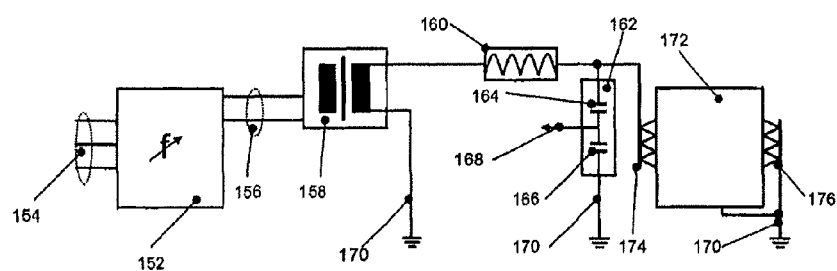
FIG. 3 shows an overview of an exemplary resonant circuit according to an embodiment of the present disclosure.

FIG. 3 shows a schematic overview circuit diagram of an exemplary embodiment of a resonant circuit 150, to which some of the test components can be connected for tests at particularly high voltages. A resonant circuit such as this has a single phase, that is to say, in the case of the test components such as the test transformer or voltage transformers which in some cases are indicated in FIG. 1 as having three phases, only one phase is in each case used in this arrangement.

Three phases of an inverter 152 are connected by its inputs 154 to a voltage supply on site, for example 400 V, 50 Hz. During operation, a regulated AC voltage is produced at the outputs 156 of the inverter 152, and these outputs 156 are connected to the connections on the low-voltage side of a test transformer 158. According to an exemplary embodiment, the regulated AC voltage can be smoothed by filters. The frequency of the AC voltage is regulated such that the resonant circuit is excited at its resonant frequency. The resonant circuit has a high-voltage inductor 160, a unit under test 172 and a capacitive voltage divider 162. The components are matched to one another to create a resonant frequency at somewhat above the normal 50 Hz mains frequency, for example 150 Hz, with this depending on the characteristic data of the unit under test to be tested. In the illustrated example of FIG. 3, the unit under test 172 is a 3-phase power transformer, whose connections on the low-voltage side are each connected to ground 170, and whose connections 174 on the high-voltage side are electrically connected in parallel with one another in the resonant circuit.

Voltages up to several 100 kV can be produced in an arrangement such as this, and can be measured by the voltage divider 162, which has two capacitors 164 and 166. The voltage can be a reference variable for frequency regulation of the inverter 152.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

50 Plan view of exemplary test arrangement
52 Container
54 Inverter
56 Filter
58 Test transformer
60 Test transformer connections
62 First voltage transformer
64 Second voltage transformer
66 Third voltage transformer
68 High-voltage inductor in the first position
70 High-voltage inductor in the second position
72 Movement apparatus
74 Movement direction
80 Supporting apparatus
82 Measurement room
84 Measurement/evaluation apparatus
86 Voltage divider
88 Connection
100 Side view of exemplary test arrangement
102 First transport apparatus
104 Second transport apparatus
106 Wheel
108 High-voltage inductor in the first position
110 High-voltage inductor in the second position
112 Movement apparatus
114 Movement direction
116 Movement apparatus
118 Movement direction
120 Voltage divider in the first position
122 Voltage divider in the second position
124 Container
150 Overview diagram of exemplary resonant circuit
152 Inverter
154 Inputs of the inverter
156 Outputs of the inverter
158 Test transformer
160 High-voltage inductor
162 Voltage divider
164 Capacitor
166 Capacitor
168 Measurement voltage
170 Ground
172 Power transformer
174 Short-circuited connections on the high-voltage side
176 Short-circuited connections on the low-voltage side

What is claimed is:

1. A test arrangement for AC voltage testing of electrical high-voltage components, the test arrangement comprising:
    test components including at least one inverter, at least one test transformer, and at least one high-voltage inductor;
    a cuboid container in which the test components are commonly arranged;
    a first movement apparatus configured to move the at least one high-voltage inductor at least partially out of the container, through at least one first opening on a boundary surface of the container;
    a voltage divider configured to be arranged in the container; and
    a second movement apparatus configured to move the voltage divider at least partially out of the container, through at least one second opening on a boundary surface of the container.

2. The test arrangement as claimed in claim 1, wherein at least one of the first opening and the second opening is located on a vertical boundary surface of the container, and at least one of the first movement apparatus and the second movement apparatus is configured to act predominantly in the horizontal direction.

3. The test arrangement as claimed in claim 2, comprising:
    a support apparatus configured to support at least one of (i) the first movement apparatus with the high-voltage inductor having been moved at least partially out of the container, and (ii) the second movement apparatus with the voltage divider having been moved at least partially out of the container.

4. The test arrangement as claimed in claim 1, wherein at least one of the first opening and the second opening is located on the upper boundary surface of the container, and at least one of the first movement apparatus and the second movement apparatus is configured to act predominantly in the vertical direction.

5. The test arrangement as claimed in claim 1, wherein the container is structured such that at least one of the first opening and the second opening in the container are closeable.

6. The test arrangement as claimed in claim 1, wherein at least one of the first movement apparatus and the second movement apparatus comprises a drive mechanism.

7. The test arrangement as claimed in claim 1, wherein the container is connected to a transport apparatus having wheels for supporting the transport apparatus.

8. The test arrangement as claimed in claim 1, wherein the container constitutes a transportable freight container having predetermined dimensions.

9. The test arrangement as claimed in claim 1, wherein the container has an internal area in which at least one of a measurement apparatus and an evaluation apparatuses are arranged.

10. The test arrangement as claimed in claim 1, wherein at least some of the test components are electrically connected to one another by means of insulated high-voltage cables.

11. A test arrangement for AC voltage testing of electrical high-voltage components, the test arrangement comprising:
    test components including at least one inverter, at least one test transformer, and at least one high-voltage inductor;
    a cuboid container in which the test components are commonly arranged;
    a first movement apparatus configured to move the at least one high-voltage inductor at least partially out of the container, through at least one first opening on a boundary surface of the container;
    wherein the test arrangement comprises an electrical resonant circuit having the at least one high-voltage inductor, a high-voltage component to be tested, and a voltage divider connected to the component to be tested.

12. The test arrangement as claimed in claim 11, wherein the at least one test transformer is connected to the resonant circuit, and the resonant circuit is configured to be excited by the at least one inverter and the at least one test transformer.

13. The test arrangement as claimed in claim 11, comprising:
a voltage divider connected to the at least one high-voltage inductor, wherein:
the at least one high-voltage inductor has at least one electrical conductor which is arranged in a multiplicity of turns around a winding axis, the turns radially surrounding an internal area along the winding axis; and
the voltage divider comprises at least one first capacitor arranged in the internal area, and at least one second capacitor which is electrically connected to the at least one first capacitor.

14. The test arrangement as claimed in claim 1, comprising:
a remote control configured to initiate at least one test operation to be performed by the test arrangement.

15. The test arrangement as claimed in claim 1, wherein the at least one first opening is located on a vertical boundary surface of the container, and the first movement apparatus is configured to act predominantly in the horizontal direction.

16. The test arrangement as claimed in claim 15, comprising:
a support apparatus configured to support the first movement apparatus with the high-voltage inductor having been moved at least partially out of the container.

17. The test arrangement as claimed in claim 1, wherein the at least one first opening is located on the upper boundary surface of the container, and the first movement apparatus is configured to act predominantly in the vertical direction.

18. The test arrangement as claimed in claim 12, comprising:
a voltage divider connected to the at least one high-voltage inductor, wherein:
the at least one high-voltage inductor has at least one electrical conductor which is arranged in a multiplicity of turns around a winding axis, the turns radially surrounding an internal area along the winding axis; and
the voltage divider comprises at least one first capacitor arranged in the internal area, and at least one second capacitor which is electrically connected to the at least one first capacitor.

19. The test arrangement as claimed in claim 11, comprising:
a second movement apparatus configured to move the voltage divider at least partially out of the container, through at least one second opening on a boundary surface of the container.

20. The test arrangement as claimed in claim 19, wherein at least one of the first opening and the second opening is located on a vertical boundary surface of the container, and at least one of the first movement apparatus and the second movement apparatus is configured to act predominantly in the horizontal direction.

* * * * *